(12) United States Patent
Richardson et al.

(10) Patent No.: US 9,019,044 B2
(45) Date of Patent: Apr. 28, 2015

(54) FILTER FOR A MAGNETRON POWER SUPPLY LEAD

(75) Inventors: Robert Richardson, Chelmsford (GB); Karl Osbourne, Colchester (GB)

(73) Assignee: E2V Technologies (UK) Limited, Chelmsford (GB)

( * ) Notice: Subject to any disclaimer, the term of this patent is extended or adjusted under 35 U.S.C. 154(b) by 39 days.

(21) Appl. No.: 13/985,008

(22) PCT Filed: Feb. 9, 2012

(86) PCT No.: PCT/GB2012/050281
§ 371 (c)(1),
(2), (4) Date: Aug. 12, 2013

(87) PCT Pub. No.: WO2012/107763
PCT Pub. Date: Aug. 16, 2012

(65) Prior Publication Data
US 2013/0321099 A1    Dec. 5, 2013

(30) Foreign Application Priority Data
Feb. 11, 2011 (GB) .................................. 1102459.3

(51) Int. Cl.
*H03H 7/01* (2006.01)
*H01J 23/15* (2006.01)
*H01J 25/587* (2006.01)

(52) U.S. Cl.
CPC .............. *H03H 7/0138* (2013.01); *H01J 23/15* (2013.01); *H01J 25/587* (2013.01)

(58) Field of Classification Search
USPC ....... 333/156, 160, 181, 182, 202, 206, 81 R, 333/81 A
See application file for complete search history.

(56) References Cited

U.S. PATENT DOCUMENTS

| | | |
|---|---|---|
| 3,727,098 A | 4/1973 | Crapuchettes |
| 3,922,612 A | 11/1975 | Tashiro |
| 4,146,854 A | 3/1979 | Ishino et al. |
| 4,163,175 A | 7/1979 | Tashiro |
| 4,638,272 A | 1/1987 | Ive |
| 5,287,074 A | 2/1994 | Meguro et al. |
| 5,406,167 A | 4/1995 | Choi |

FOREIGN PATENT DOCUMENTS

| | | |
|---|---|---|
| GB | 1399631 A | 7/1975 |
| GB | 1436928 A | 5/1976 |
| GB | 1487583 | 10/1977 |

OTHER PUBLICATIONS

Great Britain Search Report of GB1102459.3 dated Jun. 9, 2011.
International Search Report of PCT/GB2012/050281 dated May 24, 2012 with Written Opinion.

*Primary Examiner* — An Luu
(74) *Attorney, Agent, or Firm* — Venable LLP; Robert Kinberg

(57) ABSTRACT

An inductive filter for a magnetron power supply lead comprises an electrically insulating tube; a power lead located partially within the electrically insulating tube, and coaxial therewith, for supplying power from a magnetron power supply to a magnetron, a first core of a first magnetic material and a second core of a second magnetic material coaxially located on the electrically insulating tube; an insulating disc of same external diameter as the first core and the second core and coaxially located on the electrically insulating tube between the first core and the second core. The inductive filter is arranged to filter noise of a first frequency band and noise of a second, different, frequency band different from being transmitted along the power lead and to absorb a predetermined transient voltage from being transmitted along the power lead.

12 Claims, 2 Drawing Sheets

-- PRIOR ART --

FILTER FOR A MAGNETRON POWER SUPPLY LEAD

BACKGROUND

Referring to FIG. 1, the use of an outer connection of a standard coaxial cable 50 with a sufficiently high voltage rating and an outer part of a connector 60 such as a PL259 or Type N for high voltage connections is known. The outer layer 51 of the coaxial cable is stripped well back from the inner insulator 52 for suitable voltage creep clearance between the inner and outer conductors and the outer part of the connector 60 is electrically and mechanically connected to the coaxial cable braid. The end of the coaxial inner conductor has a suitable connector 61 fitted for connection to a load device. FIG. 1 shows the use of such a known 4 mm pin coaxial connector.

Magnetrons generate electrical noise from their high voltage terminals. For a typical magnetron this broadband noise can cover the frequency range of ~100 MHz to ~600 MHz. Rectifier commutation noise associated with rectifiers used to power magnetrons is usually in the frequency range of ~1 MHz to ~20 MHz.

It is well known that inductors can be made by the simple expedient of slipping magnetic cores over a conductor to obtain a desired inductance over a desired frequency range. However, it is unlikely that a single inductor would be effective over the two frequency ranges of the two noise sources outlined above. To filter noise with these different frequency ranges and provide inductors optimised for attenuation in these two different frequency ranges two different inductor core are used in series, which may have respective inductances La and Lb. For each magnetic core the inductance and Q is optimised by a suitable choice of materials for the cores to cover an appropriate frequency range.

GB 1 487 583 and U.S. Pat. No. 3,922,612 disclose a choking circuit comprising a low pass filter for a magnetron which emits VHF and UHF interference in which a pair of choke members is connected between respective heater leads and power input terminals, each choke member being comprised of at least one choke element including a first ferrite core of high intrinsic resistivity, e.g. 10 kΩ·cm, and at least one second choke element of low intrinsic resistivity, e.g. 30 Ω·cm, the two choke members being connected in series. The coke members comprise series connected coils and cores inserted therein. The chokes are located in a shielding enclosure. Provision of the choke members substantially prevents leakage of objectionable microwave noise. A metal shield plate may be inserted between the low and high resistivity cores to obtain magnetic isolation between the cores for more effective absorption of microwave noise. In an embodiment three chokes may be used in series for each lead. Alternatively, the choke members may include two ferrite beads in series around the leads, a first ferrite bead of high intrinsic resistivity and a second ferrite bead of low intrinsic resistivity, each having two bores for receiving the two heater wires. The choke members may comprise a plurality of groups of alternate low and high resistivity ferrite cores.

GB 1 436 928 discloses a magnetron having a cathode lead with a microwave attenuating ferrite bead.

U.S. Pat. No. 4,163,175 suggests that a magnetron in which an electromagnetic energy absorber such as a ferrite bead is wrapped around a cathode holder is well known but the ferrite bead may overheat through the absorption of electromagnetic energy and from the hot cathode causing the ferrite bead to generate a large quantity of gas. There is disclosed a ring-shaped HF energy absorber in contact with a heat conductor in the vicinity of the cathode holder to prevent such overheating of the ferrite inductor.

However, magnetrons can also arc, i.e. generate a short circuit very rapidly. In this situation a full working voltage of a magnetron, which is typically 20 kV, would be transiently applied across the inductors. Such a high voltage could damage the magnetic materials used for the magnetic cores.

BRIEF SUMMARY OF THE DISCLOSURE

According to a first aspect of the present invention there is provided an inductive filter for a magnetron power supply lead, the filter comprising: electrically insulating tube means; power lead means located partially within the electrically insulating tube means, substantially coaxial with the electrically insulating tube means, for supplying power from a magnetron power supply to a magnetron; first magnetic core means of a first magnetic material coaxially located on the electrically insulating tube means; second magnetic core means of a second magnetic material coaxially located on the electrically insulating tube means; insulating disc means of at least a same external diameter as the first magnetic core means and the second magnetic core means and coaxially located on the electrically insulating tube means between the first magnetic core means and the second magnetic core means; wherein the inductive filter is arranged substantially to filter electrical noise in a first predetermined frequency band and electrical noise in a second predetermined frequency band higher or lower than the first predetermined frequency band from being transmitted along the power lead means and to absorb a predetermined transient voltage transmitted along the power lead means.

Conveniently, the inductive filter further comprises: a third magnetic core means of a third magnetic material coaxially located on the electrically insulating tube means and further insulating disc means of at least a same external diameter as the first magnetic core means, the second magnetic core means and the third magnetic core means wherein the further insulating disc means is coaxially located on the electrically insulating tube means between the second magnetic core means and the third magnetic core means; wherein the first magnetic core means is arranged substantially to filter electrical noise in the first predetermined frequency band; the second magnetic core means is arranged substantially to filter electrical noise in the second predetermined frequency band and the third magnetic core means is arranged to absorb the predetermined transient voltage from being transmitted along the power lead means.

Advantageously, the inductive filter comprises a plurality of sets of magnetic core means and insulating disc means, as described above.

Conveniently, the magnetic core means and insulating disc means are proximate to each other along the insulating tube means.

Advantageously, the insulating disc means is arranged to prevent a voltage breakdown with a resultant tracking current flow across surfaces of the series of magnetic core means.

Conveniently, the power lead means is an inner conductor of a coaxial cable.

Conveniently, the indicative filter is located within EMC screening means and an outer electrical conductor of the coaxial cable is electrically connected to the screening means.

According to a second aspect of the invention, there is provided a method of filtering a power supply lead for a magnetron, the method comprising: providing power lead means located partially within electrically insulating tube means, substantially coaxial with the electrically insulating tube means, for supplying power from a magnetron power supply to a magnetron; and using first magnetic core means of a first magnetic material and second magnetic core means of a second magnetic material coaxially arranged on the electrically insulating tube means to filter electrical noise in a first predetermined frequency band and electrical noise in a second predetermined frequency band higher or lower than the first predetermined frequency band from being transmitted along the power lead means; and to absorb a predetermined transient voltage otherwise transmitted along the power lead means.

Conveniently, the first magnetic core means filters electrical noise in the first predetermined frequency band; the second magnetic core means filters electrical noise in the second predetermined frequency band; and a third magnetic core means of a third magnetic material coaxially arranged on the electrically insulating tube means absorbs the predetermined transient voltage otherwise transmitted along the power lead means.

Conveniently, insulating disc means, of at least a same external diameter as the first magnetic core means and the second magnetic core means, and coaxially located on the electrically insulating tube means between the magnetic core means, prevent a voltage breakdown with resultant tracking current flow across surfaces of the series of magnetic core means.

Advantageously, the method comprises using a plurality of sets of magnetic core means and insulating disc means, as claimed therein.

BRIEF DESCRIPTION OF THE DRAWINGS

Embodiments of the invention are further described hereinafter with reference to the accompanying drawings, in which.

DETAILED DESCRIPTION

Figure 2A:
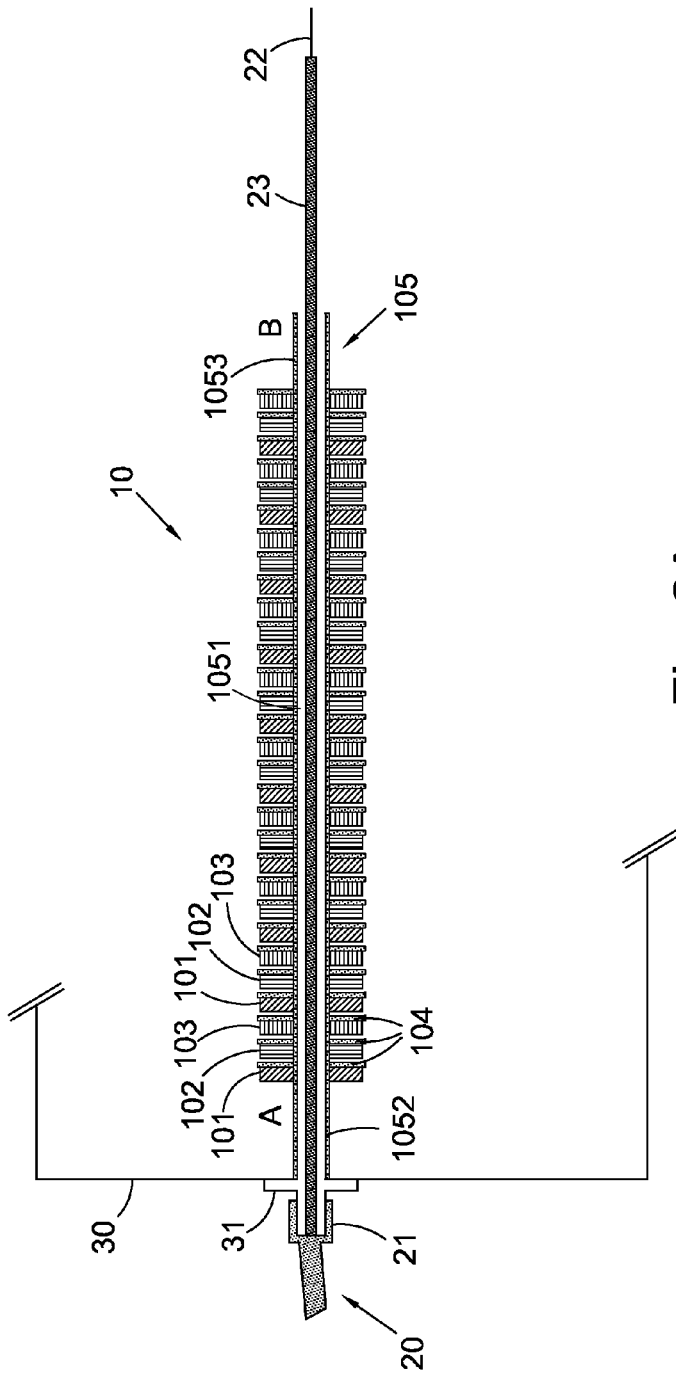
FIG. 2A is a cross-sectional diagram of sets of three types of magnetic core inductors in series according to the invention around a central insulator of a coaxial cable for supplying power to a magnetron.

Referring to FIG. 2A, a magnetic core inductor 10 according to an embodiment of the invention comprises sets of three magnetic cores 101, 102, 103, having different inductances La, Lb and Lc respectively, arranged in series. An outer conductor 21 of a coaxial cable 20 from an EHT power supply, not shown, for supplying power to a magnetron, not shown, is electrically and mechanically connected to a coaxial cable outer connector 31 in electrical contact with a conductive bulkhead 30 that shields the whole assembly for safety and EMC purposes. A portion of an inner conductor 22 and inner insulator 23 of the coaxial cable 20, without the outer conductor 21 and outer insulator, is passed through an electrically insulating elongate linear tube 105 for connection of the inner conductor 22 to a cathode of the magnetron. Located coaxially about a central portion 1051 of the elongate linear tube 105 is a repeating pattern of a first annular magnetic core 101, a first insulating disc 104, a second annular magnetic core 102, a second insulating disc 104, a third annular magnetic core 103 and a third insulating disc 104. The first annular magnetic core 101, second annular magnetic core 102 and the third annular magnetic core 103 are of different magnetic materials but of substantially the same dimensions. The first, second and third insulating discs 104 are substantially identical to each other. The annular magnetic cores 101, 102, 103 and the insulating disc 104 have a substantially same external diameter and have an internal diameter to form a sliding fit on the insulating tube 105. This pattern of magnetic cores 101, 102, 103 and insulating discs 104 is repeated along the central portion 1051 of the tube 105. A magnetic core 101 most proximate to the bulkhead connection 31 is spaced therefrom by a first end portion 1052 of the elongate linear tube 105 without magnetic cores or insulating discs. The insulating disc 104 most distal from the bulkhead connection 31 is spaced from an end of the tube 105 most distal from the bulkhead connection 31 by a second end portion 1053, opposed to the first end portion, of the elongate linear tube 105 without magnetic cores or insulating discs. A portion of the inner insulator 23 of the coaxial cable extends beyond the distal end of the elongate linear tube 105 for connection of the inner conductor 22 of the coaxial cable to the magnetron, not shown.

The respective inductances La and Lb of the first and second magnetic cores 101, 102 are selected for filtering magnetron noise and rectifier commutation noise having typical frequency ranges of ~100 MHz to ~600 MHz using magnetic materials such as Micrometals Mix 12 or 17 and ~1 MHz to ~20 MHz using magnetic materials such as Micrometals Mix 4, 6, or 7 respectively, the example magnetic materials being available from Micrometals Inc. 5615 E. La Palma Avenue, Anaheim, Calif. 92807 USA. A third magnetic material is used for the third magnetic core 103 of inductance Lc. This core material is selected for both high permeability and high flux density at lower frequencies of less than 100 kHz using magnetic materials such as Micrometals Mix 26. The magnetic cores of inductance Lc are designed by experiment to ensure that a voltage transiently appearing across a length of the series of inductors, for example between the points A to B in FIG. 2A, is reduced to a level such that the proportion of voltage across each of the magnetic cores 101, 102 and 103 is within the voltage ratings of the individual magnetic cores.

Figure 2B:
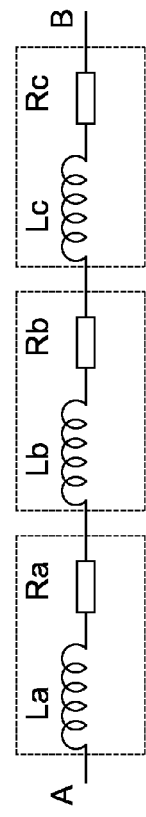
FIG. 2B is an equivalent circuit diagram of the inductance and resistance provided by the sets of three magnetic core inductors in series of FIG. 2A.

Thus a feature of the invention is the use of different magnetic core materials to perform quite different respective functions. It will be seen in the embodiment illustrated in FIG. 2A that more than one core of a same magnetic material is used for each function and that they are interleaved in a repeating pattern. Despite the use of a plurality of sets of cores in series it can be shown that the equivalent electrical circuit of the series of magnetic cores is substantially a series of three pairs of inductance and resistance in series La and Ra, Lb and Rb and Lc and Rc, as shown in FIG. 2B.

Furthermore, the distributed nature of the magnetic cores with respective inductances La, Lb, and Lc ensures that when the magnetron arcs, the transient high voltage is distributed evenly across the length A to B of the series of cores. The distance A to B is determined by the number of magnetic cores used but must be longer than a minimum distance required to prevent voltage creepage. Information on creepage distances can be found in standards EN60950 and IEC664-1.

When using a coaxial cable 20 to feed a steady DC voltage to a load such as a magnetron, the DC voltage rating of the cable is considerably less when the voltage is subjected to a rapid transient, such as occurs during arcing of a magnetron, than when the cable is subject to a constant voltage. To ensure the voltage rating under the transient conditions is adequate, the tube 105 used to support the magnetic cores 101, 102, 103 is electrically insulating. The electrically insulating discs 104 located between the magnetic cores ensure a high voltage across the series of magnetic cores, between points A and B in FIG. 2A, does not track across the magnetic core surfaces, typical magnetic materials used for the cores being electrically conductive.

Figure 1:
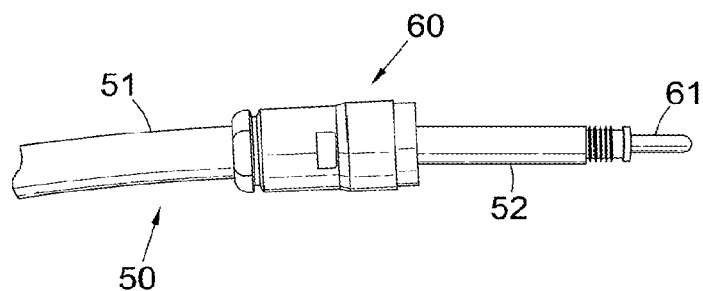
FIG. 1 illustrates a prior art high voltage coaxial connector.
Figure 3:
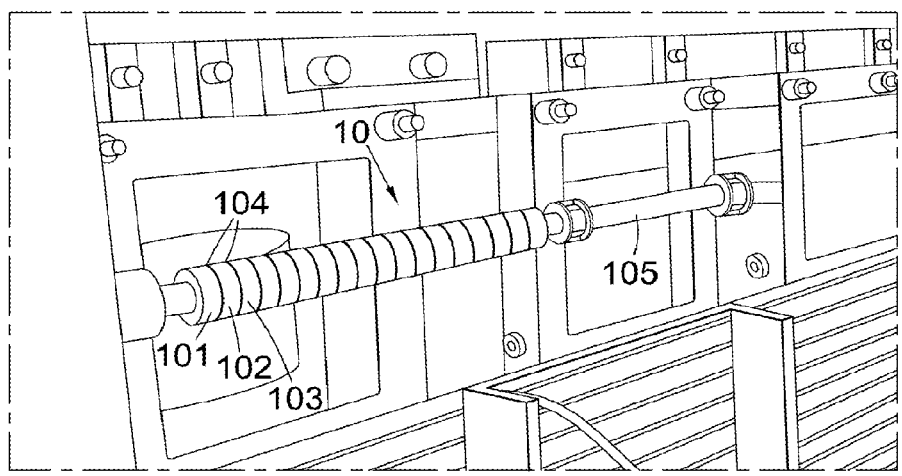
FIG. 3 illustrates an embodiment of the inner conductor and magnetic cores of FIG. 2A.

FIG. 3 shows a typical implementation of the invention showing the magnetic cores assembled on an electrically insulating tube. An inner conductor and inner insulator of a coaxial cable is shown fed through the tube to a 20 kV DC output of a High Voltage Transformer Rectifier Unit (HVTRU). The magnetic core and tube assembly is secured with standard cable cleats. A coaxial connector is out of view on a conductive case that shields the equipment for safety and EMC purposes. Such an inductor may be placed around a power supply lead between a negative terminal of a rectifier and a magnetron heater transformer described in, for example, WO 2008/149133.

It will be understood that in some situations, as described above, three different types of magnetic cores 101, 102, 103 with different respective inductances La, Lb, and Lc are conveniently used for the three purposes of filtering magnetron noise, filtering rectifier commutation noise and accommodating arcing of the magnetron. However, it is envisaged that if, for example, cores Lb and Lc were able to perform two of the functions and a combination of Lb and Lc were able to perform the third function, only two types of magnetic core would be required, but the same mechanical arrangement and distribution of the magnetic cores would otherwise be used for the two different types of magnetic core as used for the three types of magnetic core in FIG. 2A.

It will be further understood that the filter of the invention filters noise from the rectifier from reaching the magnetron as well as filtering noise from the magnetron from reaching the power supply circuit comprising the rectifier. Moreover, in contrast with the prior art, it will be noted that the filter is located on the power supply lead, and not within the magnetron. This simplifies design and construction of the magnetron.

Although the invention has been described in relation to noise filtering for magnetrons, a person skilled in the art will understand that the invention has application in other situations, particularly where noise filtering in two distinct frequency bands and transient voltage protection is desirable.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. An inductive filter for a magnetron power supply lead, the filter comprising:
   an electrically insulating tube;
   a power lead located partially within the electrically insulating tube, substantially coaxial with the electrically insulating tube, for supplying power from a magnetron power supply to a magnetron;
   a first magnetic core of a first magnetic material coaxially located on the electrically insulating tube;
   a second magnetic core of a second magnetic material coaxially located on the electrically insulating tube;
   an insulating disc of at least a same external diameter as the first magnetic core and the second magnetic core and coaxially located on the electrically insulating tube between the first magnetic core and the second magnetic core;
   wherein the inductive filter is arranged substantially to filter electrical noise in a first predetermined frequency band and electrical noise in a second predetermined frequency band higher or lower than the first predetermined frequency band from being transmitted along the power lead and to absorb a predetermined transient voltage transmitted along the power lead.

2. An inductive filter as claimed in claim 1 further comprising:
   a third magnetic core of a third magnetic material coaxially located on the electrically insulating tube and further an insulating disc of at least a same external diameter as the first magnetic core, the second magnetic core and the third magnetic core, wherein the further insulating disc coaxially located on the electrically insulating tube between the second magnetic core and the third magnetic core;
   wherein the first magnetic core is arranged substantially to filter electrical noise in the first predetermined frequency band; the second magnetic core is arranged substantially to filter electrical noise in the second predetermined frequency band and the third magnetic core is arranged to absorb the predetermined transient voltage from being transmitted along the power lead.

3. An inductive filter as claimed in claim 1, comprising a plurality of sets of magnetic cores and insulating discs.

4. An inductive filter as claimed in claim 1, wherein the magnetic core and insulating disc are proximate to each other along the insulating tube.

5. An inductive filter as claimed in claim 1, wherein the insulating disc is arranged to prevent a voltage breakdown with a resultant tracking current flow across surfaces of the series of magnetic core means.

6. An inductive filter as claimed in claim 1, wherein the power lead is an inner conductor of a coaxial cable.

7. An inductive filter as claimed in claim 6, wherein the indicative filter is located within an EMC screening device and an outer electrical conductor of the coaxial cable is electrically connected to the screening device.

8. A method of filtering a power supply lead for a magnetron, the method comprising:
   a. providing a power lead located partially coaxially within electrically an insulating tube for supplying power from a magnetron power supply to a magnetron; and
   b. using a first magnetic core of a first magnetic material and a second magnetic core of a second magnetic material arranged on the electrically insulating tube, substantially coaxial with the electrically insulating tube, to filter electrical noise in a first predetermined frequency band and electrical noise in a second predetermined frequency band higher or lower than the first predetermined frequency band from being transmitted along the power lead; and to absorb a predetermined transient voltage otherwise transmitted along the power lead.

9. A method as claimed in claim 8, comprising:
   a. using the first magnetic core to filter electrical noise in the first predetermined frequency band;
   b. using the second magnetic core to filter electrical noise in the second predetermined frequency band; and
   c. using a third magnetic core of a third magnetic material coaxially arranged on the electrically insulating tube to absorb the predetermined transient voltage otherwise transmitted along the power lead.

10. A method as claimed in claim 8, further comprising using an insulating disc of at least a same external diameter as the first magnetic core and the second magnetic core coaxially located on the electrically insulating tube between the magnetic cores, to prevent a voltage breakdown with a resultant tracking current flow across surfaces of the series of magnetic cores.

11. A method as claimed in claim 10, comprising using a plurality of sets of magnetic cores and insulating discs.

12. A method of filtering a power supply lead for a magnetron, comprising utilizing the inductive filter according to claim 1.

* * * * *